US008502709B2

(12) United States Patent
Jia

(10) Patent No.: US 8,502,709 B2
(45) Date of Patent: *Aug. 6, 2013

(54) DECODING VARIABLE LENGTH CODES IN MEDIA APPLICATIONS

(75) Inventor: Wei Jia, San Jose, CA (US)

(73) Assignee: NVIDIA Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/901,484

(22) Filed: Sep. 17, 2007

(65) Prior Publication Data

US 2009/0073007 A1    Mar. 19, 2009

(51) Int. Cl.
*H03M 7/40* (2006.01)

(52) U.S. Cl.
USPC .............................................. 341/67; 341/50

(58) Field of Classification Search
USPC ................... 341/50, 51, 67, 65; 382/232, 246
See application file for complete search history.

(56) References Cited

U.S. PATENT DOCUMENTS

| | | | |
|---|---|---|---|
| 5,163,136 A | 11/1992 | Richmond | |
| 5,189,671 A | 2/1993 | Cheng | |
| 5,774,206 A | 6/1998 | Wasserman et al. | |
| 5,796,743 A | 8/1998 | Bunting et al. | |
| 5,821,886 A | 10/1998 | Son | |
| 6,008,745 A | 12/1999 | Zandi et al. | |
| 6,009,203 A | 12/1999 | Liu et al. | |
| 6,023,088 A | 2/2000 | Son | |
| 6,041,403 A | 3/2000 | Parker et al. | |
| 6,047,357 A | 4/2000 | Bannon et al. | |
| 6,144,322 A | 11/2000 | Sato | |
| 6,246,347 B1 * | 6/2001 | Bakhmutsky | 341/67 |
| 6,298,370 B1 | 10/2001 | Tang et al. | |
| 6,317,063 B1 | 11/2001 | Matsubara | |
| 6,339,658 B1 | 1/2002 | Moccagatta et al. | |
| 6,441,757 B1 * | 8/2002 | Hirano | 341/67 |
| 6,456,340 B1 | 9/2002 | Margulis | |
| 6,462,744 B1 | 10/2002 | Mochida et al. | |
| 6,480,489 B1 | 11/2002 | Muller et al. | |
| 6,543,023 B2 | 4/2003 | Bessios | |
| 6,552,673 B2 | 4/2003 | Webb | |
| 6,563,440 B1 | 5/2003 | Kangas | |

(Continued)

FOREIGN PATENT DOCUMENTS

| | | |
|---|---|---|
| CN | 101017574 A | 2/2007 |
| JP | 06276394 | 9/1994 |

(Continued)

OTHER PUBLICATIONS

English Translation of Office Action for Chinese Patent Application No. 200810212373.X, Entitled: Decoding Variable Length Codes in JPEG Applications.

(Continued)

*Primary Examiner* — Peguy JeanPierre

(57) ABSTRACT

An approach to decoding variable length code (VLC) symbols is described. In one embodiment, a method of decoding VLC symbols is detailed. This method involves obtaining a bitstream sample from a bitstream, and comparing the bitstream sample against a threshold value, to obtain a VLC group number. Information associated with a VLC group is retrieved, using this VLC group number. The current VLC symbol is extracted from the bitstream, using the VLC group information, and the corresponding symbol value is obtained, using the current VLC symbol and the VLC group information.

20 Claims, 18 Drawing Sheets

Flowchart 700

U.S. PATENT DOCUMENTS

| | | | |
|---|---|---|---|
| 6,563,441 B1 | 5/2003 | Gold | |
| 6,577,681 B1 | 6/2003 | Kimura | |
| 6,587,057 B2 | 7/2003 | Scheuermann | |
| 6,654,539 B1 | 11/2003 | Duruoz et al. | |
| 6,675,282 B2 | 1/2004 | Hum et al. | |
| 6,696,992 B1 * | 2/2004 | Chu | 341/67 |
| 6,795,503 B2 | 9/2004 | Nakao et al. | |
| 6,839,624 B1 | 1/2005 | Beesley et al. | |
| 6,891,976 B2 * | 5/2005 | Zheltov et al. | 382/246 |
| 6,981,073 B2 | 12/2005 | Wang et al. | |
| 7,016,547 B1 | 3/2006 | Smirnov | |
| 7,051,123 B1 | 5/2006 | Baker et al. | |
| 7,068,407 B2 | 6/2006 | Sakai et al. | |
| 7,068,919 B2 | 6/2006 | Ando et al. | |
| 7,069,407 B1 | 6/2006 | Vasudevan et al. | |
| 7,074,153 B2 | 7/2006 | Usoro et al. | |
| 7,113,115 B2 | 9/2006 | Partiwala et al. | |
| 7,113,546 B1 | 9/2006 | Kovacevic et al. | |
| 7,119,813 B1 | 10/2006 | Hollis et al. | |
| 7,129,862 B1 | 10/2006 | Shirdhonkar et al. | |
| 7,132,963 B2 | 11/2006 | Pearlstein et al. | |
| 7,158,539 B2 | 1/2007 | Zhang et al. | |
| 7,209,636 B2 | 4/2007 | Imahashi et al. | |
| 7,230,986 B2 | 6/2007 | Wise et al. | |
| 7,248,740 B2 | 7/2007 | Sullivan | |
| 7,286,543 B2 | 10/2007 | Bass et al. | |
| 7,289,047 B2 | 10/2007 | Nagori | |
| 7,324,026 B2 | 1/2008 | Puri et al. | |
| 7,327,378 B2 | 2/2008 | Han et al. | |
| 7,366,240 B2 | 4/2008 | Chiang Wei Yin et al. | |
| 7,372,378 B2 | 5/2008 | Sriram | |
| 7,372,379 B1 | 5/2008 | Jia et al. | |
| 7,404,645 B2 | 7/2008 | Margulis | |
| 7,432,835 B2 * | 10/2008 | Ohashi et al. | 341/67 |
| 7,496,234 B2 | 2/2009 | Li | |
| 7,606,313 B2 | 10/2009 | Raman et al. | |
| 7,627,042 B2 | 12/2009 | Raman et al. | |
| 7,660,352 B2 | 2/2010 | Yamane et al. | |
| 7,724,827 B2 | 5/2010 | Liang et al. | |
| 7,765,320 B2 | 7/2010 | Vehse et al. | |
| 2001/0010755 A1 | 8/2001 | Ando et al. | |
| 2001/0026585 A1 | 10/2001 | Kumaki | |
| 2002/0063807 A1 | 5/2002 | Margulis | |
| 2002/0094031 A1 * | 7/2002 | Ngai et al. | 375/240.27 |
| 2003/0043919 A1 | 3/2003 | Haddad | |
| 2003/0156652 A1 | 8/2003 | Wise et al. | |
| 2003/0179706 A1 | 9/2003 | Goetzinger et al. | |
| 2003/0196040 A1 | 10/2003 | Hosogi et al. | |
| 2004/0028142 A1 | 2/2004 | Kim | |
| 2004/0056787 A1 | 3/2004 | Bossen | |
| 2004/0059770 A1 | 3/2004 | Bossen | |
| 2004/0067043 A1 | 4/2004 | Duruoz et al. | |
| 2004/0081245 A1 | 4/2004 | Deeley et al. | |
| 2004/0096002 A1 | 5/2004 | Zdepski et al. | |
| 2004/0130553 A1 | 7/2004 | Ushida et al. | |
| 2004/0145677 A1 | 7/2004 | Raman et al. | |
| 2004/0158719 A1 * | 8/2004 | Lee et al. | 713/176 |
| 2005/0008331 A1 | 1/2005 | Nishimura et al. | |
| 2005/0123274 A1 | 6/2005 | Crinon et al. | |
| 2005/0147375 A1 * | 7/2005 | Kadono | 386/4 |
| 2005/0182778 A1 | 8/2005 | Heuer et al. | |
| 2005/0207497 A1 | 9/2005 | Rovati et al. | |
| 2006/0013321 A1 | 1/2006 | Sekiguchi et al. | |
| 2006/0067582 A1 | 3/2006 | Bi et al. | |
| 2006/0083306 A1 | 4/2006 | Hsu | |
| 2006/0133500 A1 * | 6/2006 | Lee et al. | 375/240.16 |
| 2006/0176960 A1 | 8/2006 | Lu et al. | |
| 2006/0256120 A1 | 11/2006 | Ushida et al. | |
| 2007/0006060 A1 | 1/2007 | Walker | |
| 2007/0288971 A1 | 12/2007 | Cragun et al. | |
| 2008/0317138 A1 | 12/2008 | Jia | |
| 2009/0196356 A1 | 8/2009 | Houki | |

FOREIGN PATENT DOCUMENTS

| | | |
|---|---|---|
| JP | 09261647 | 10/1997 |
| JP | 2000049621 | 2/2000 |
| KR | 1020030016859 | 3/2003 |
| TW | 200428879 | 11/2004 |
| TW | 200520535 | 12/2009 |
| WO | 01/24425 | 4/2010 |

OTHER PUBLICATIONS

English Translation of Office Action for Chinese Patent Application No. 200810212373.X, Entitled: Decoding Variable Length Codes in JPEG Applications, Mar. 30, 2010.

Miska Hannuksela, Picture Decoding Method, USPTO Provisional Application filed Feb. 18, 2003; U.S. Appl. No. 60/448,189.

Ting-Kun Yeh et al., Video Decoder, USPTO Provisional Application filed Dec. 3, 2003; U.S. Appl. No. 60/526,294.

* cited by examiner

| VLC Symbol | Symbol Value |
|---|---|
| 201 → 00 | 0 ← 202 |
| 203 → 010 | 1 ← 204 |
| 205 → 011 | 2 ← 206 |
| 207 → 100 | 3 ← 208 |
| 209 → 101 | 4 ← 210 |
| 211 → 110 | 5 ← 212 |
| 213 → 1110 | 6 ← 214 |
| 215 → 11110 | 7 ← 216 |
| 217 → 111110 | 8 ← 218 |
| 219 → 1111110 | 9 ← 220 |
| 221 → 11111110 | 10 ← 222 |
| 223 → 111111110 | 11 ← 224 |

Huffman Table 200

FIG. 2

JPEG Image File 300

| Nbits | Threshold | Offset |
|---|---|---|
| 1 | | |
| 2 | 0000000000000000 — 432 | <Table 2 Address> — 442 |
| 3 | 0100000000000000 — 433 | <Table 2 Address +1> — 443 |
| 4 | 1110000000000000 — 434 | <Table 2 Address +6> — 444 |
| 5 | 1111000000000000 — 435 | <Table 2 Address +7> — 445 |
| 6 | 1111100000000000 — 436 | <Table 2 Address +8> — 446 |
| 7 | 1111110000000000 — 437 | <Table 2 Address +9> — 447 |
| 8 | 1111111000000000 — 438 | <Table 2 Address +10> — 448 |
| 9 | 1111111100000000 — 439 | <Table 2 Address +11> — 449 |
| 10 | | |
| 11 | | |
| 12 | | |
| 13 | | |
| 14 | | |
| 15 | | |
| 16 | | |

(422 → 2, 423 → 3, 424 → 4, 425 → 5, 426 → 6, 427 → 7, 428 → 8, 429 → 9)

Base Table 400

FIG. 4

| Memory Address | Symbol Value |
|---|---|
| <Table 2 Address> | 0 |
| <Table 2 Address +1> | 1 |
| <Table 2 Address +2> | 2 |
| <Table 2 Address +3> | 3 |
| <Table 2 Address +4> | 4 |
| <Table 2 Address +5> | 5 |
| <Table 2 Address +6> | 6 |
| <Table 2 Address +7> | 7 |
| <Table 2 Address +8> | 8 |
| <Table 2 Address +9> | 9 |
| <Table 2 Address +10> | 10 |
| <Table 2 Address +11> | 11 |

Secondary Table 500

FIG. 5

Flowchart 600

Flowchart 700

System 900

| | |
|---|---|
| 0 | 111101111 |
| 10000 | 111110000 |
| 10001 | 111110001 |
| 10010 | 111110010 |
| 10011 | 111110011 |
| 10100 | 111110100 |
| 10101 | 111110101 |
| 10110 | 111110110 |
| 10111 | 111110111 |
| 1100000 | 1111110000 |
| 1100001 | 1111110001 |
| 1100010 | 1111110010 |
| 1100011 | 1111110011 |
| 1100100 | 1111110100 |
| 1100101 | 1111110101 |
| 1100110 | 1111110110 |
| 1100111 | 1111110111 |
| 1101000 | 11111110000 |
| 1101001 | 11111110001 |
| 1101010 | 11111110010 |
| 1101011 | 11111110011 |
| 1101100 | 11111110100 |
| 1101101 | 11111110101 |
| 1101110 | 11111110110 |
| 1101111 | 11111110111 |
| 1110000 | 11111111000 |
| 1110001 | 11111111001 |
| 1110010 | 11111111010 |
| 1110011 | 11111111011 |
| 1110100 | 11111111100 |
| 1110101 | 11111111101 |
| 1110110 | 11111111110 |
| 1110111 | 11111111111 |
| 111100000 | |
| 111100001 | |
| 111100010 | |
| 111100011 | |
| 111100100 | |
| 111100101 | |
| 111100110 | |
| 111100111 | |
| 111101000 | |
| 111101001 | |
| 111101010 | |
| 111101011 | |
| 111101100 | |
| 111101101 | |
| 111101110 | |

Huffman Table 1000
AAC codebook book 1

FIG. 10

| VLC_code | value_pair (2-tuple) |
|---|---|
| 0000000000 | 5/5 |
| 0000000001 | 4/5 |
| 0000000010 | 5/4 |
| 0000000011 | 5/3 |
| 000000010 | 3/5 |
| 000000011 | 4/4 |
| 000000100 | 2/5 |
| 000000101 | 5/2 |
| 00000011 | 1/5 |
| 00000100 | 5/1 |
| 000001010 | 0/5 |
| 000001011 | 3/4 |
| 00000110 | 5/0 |
| 000001110 | 4/3 |
| 000001111 | 3/3 |
| 00001000 | 2/4 |
| 00001001 | 4/2 |
| 0000101 | 1/4 |
| 0000110 | 4/1 |
| 0000111 | 4/0 |
| 00010000 | 0/4 |
| 00010001 | 2/3 |
| 00010010 | 3/2 |
| 00010011 | 0/3 |
| 0001010 | 1/3 |
| 0001011 | 3/1 |
| 0001100 | 3/0 |
| 0001101 | 2/2 |
| 000111 | 1/2 |
| 00100 | 2/1 |
| 001010 | 0/2 |
| 001011 | 2/0 |
| 0011 | 1/1 |
| 010 | 0/1 |
| 011 | 1/0 |
| 1 | 0/0 |

Huffman Table 1100
MP3 codebook 2tuple7

FIG. 11A

| VLC_code | value_pair (2-tuple) |
|---|---|
| 0000000000 | 5/5 |
| 0000000001 | 4/5 |
| 0000000010 | 5/4 |
| 0000000011 | 5/3 |
| 000000010 | 3/5 |
| 000000011 | 4/4 |
| 000000100 | 2/5 |
| 000000101  1121 | 5/2 |
| 000000110 ← 1122 | 1/5 |
| 000000111 ← 1123 | 1/5 |
| 000001000 ← 1124 | 5/1 |
| 000001001 ← | 5/1 |
| 000001010 | 0/5 |
| 000001011  1125 | 3/4 |
| 000001100 ← 1126 | 5/0 |
| 000001101 ← | 5/0 |
| 000001110 | 4/3 |
| 000001111 | 3/3 |
| 00001000 | 2/4 |
| 00001001  1131 | 4/2 |
| 00001010 ← 1132 | 1/4 |
| 00001011 ← 1133 | 1/4 |
| 00001100 ← 1134 | 4/1 |
| 00001101 ← | 4/1 |
| 00001110 ← 1135 | 4/0 |
| 00001111 ← 1136 | 4/0 |
| 00010000 | 0/4 |
| 00010001 | 2/3 |
| 00010010 | 3/2 |
| 00010011 | 0/3 |
| 0001010 | 1/3 |
| 0001011 | 3/1 |
| 0001100 | 3/0 |
| 0001101 | 2/2 |
| 000111  1151 | 1/2 |
| 001000 ← 1152 | 2/1 |
| 001001 ← | 2/1 |
| 001010 | 0/2 |
| 001011 | 2/0 |
| 0011 | 1/1 |
| 010 | 0/1 |
| 011 | 1/0 |
| 1 | 0/0 |

VLC Group 1110: first 4 rows
VLC Group 1120: rows 5–18
VLC Group 1130: rows 19–30
VLC Group 1140: rows 31–34
VLC Group 1150: rows 35–39
VLC Group 1160: 0011
VLC Group 1170: 010
VLC Group 1180: 1

Huffman Table 1101
MP3 codebook 2tuple7

FIG. 11B

| Nbits | Threshold | Offset |
|---|---|---|
| 10 | 0000000000 | <Table 2 Address> |
| 9 | 0000000100 | <Table 2 Address +4> |
| 8 | 0000100000 | <Table 2 Address +18> |
| 7 | 0001010000 | <Table 2 Address +30> |
| 6 | 0001110000 | <Table 2 Address +34> |
| 4 | 0011000000 | <Table 2 Address +39> |
| 3 | 0100000000 | <Table 2 Address +40> |
| 1 | 1000000000 | <Table 2 Address +42> |

Base Table 1200

FIG. 12

| Memory Address | Symbol Value | Code Length | Memory Address | Symbol Value | Code Length |
|---|---|---|---|---|---|
| <Table 2 Address> | 5/5 | 10 | <Table 2 Address +22> | 4/1 | 7 |
| <Table 2 Address +1> | 4/5 | 10 | <Table 2 Address +23> | 4/1 | 7 |
| <Table 2 Address +2> | 5/4 | 10 | <Table 2 Address +24> | 4/0 | 7 |
| <Table 2 Address +3> | 5/3 | 10 | <Table 2 Address +25> | 4/0 | 7 |
| <Table 2 Address +4> | 3/5 | 9 | <Table 2 Address +26> | 0/4 | 8 |
| <Table 2 Address +5> | 4/4 | 9 | <Table 2 Address +27> | 2/3 | 8 |
| <Table 2 Address +6> | 2/5 | 9 | <Table 2 Address +28> | 3/2 | 8 |
| <Table 2 Address +7> | 5/2 | 9 | <Table 2 Address +29> | 0/3 | 8 |
| <Table 2 Address +8> | 1/5 | 8 | <Table 2 Address +30> | 1/3 | 7 |
| <Table 2 Address +9> | 1/5 | 8 | <Table 2 Address +31> | 3/1 | 7 |
| <Table 2 Address +10> | 5/1 | 8 | <Table 2 Address +32> | 3/0 | 7 |
| <Table 2 Address +11> | 5/1 | 8 | <Table 2 Address +33> | 2/2 | 7 |
| <Table 2 Address +12> | 0/5 | 9 | <Table 2 Address +34> | 1/2 | 6 |
| <Table 2 Address +13> | 3/4 | 9 | <Table 2 Address +35> | 2/1 | 5 |
| <Table 2 Address +14> | 5/0 | 8 | <Table 2 Address +36> | 2/1 | 5 |
| <Table 2 Address +15> | 5/0 | 8 | <Table 2 Address +37> | 0/2 | 6 |
| <Table 2 Address +16> | 4/3 | 9 | <Table 2 Address +38> | 2/0 | 6 |
| <Table 2 Address +17> | 3/3 | 9 | <Table 2 Address +39> | 1/1 | 4 |
| <Table 2 Address +18> | 2/4 | 8 | <Table 2 Address +40> | 0/1 | 3 |
| <Table 2 Address+19> | 4/2 | 8 | <Table 2 Address +41> | 1/0 | 3 |
| <Table 2 Address +20> | 1/4 | 7 | <Table 2 Address +42> | 0/0 | 1 |
| <Table 2 Address +21> | 1/4 | 7 | | | |

Secondary Table 1300

FIG. 13

Flowchart 1400

Flowchart 1500

System 1700

DECODING VARIABLE LENGTH CODES IN MEDIA APPLICATIONS

BACKGROUND

1. Field of the Invention

Embodiments of the present invention relate to decoding variable length codes (VLC) used in Joint Photographic Experts Group (JPEG) image files.

2. Related Art

In computing applications, variable length coding (VLC) encoding schemes allow for lossless data compression. In general, VLC encoding schemes utilize a probabilistic approach, where the more common symbols require fewer bits to express than the less common symbols. VLC encoding is used extensively throughout computing, and particularly in media applications, such as images, music, and video, where the uncompressed information would require far more storage space than a compressed version.

One VLC encoding scheme is Huffman coding. Huffman coding is an extremely efficient means of compressing data, particularly when the item to be compressed is used to help generate the corresponding Huffman tree, by using the occurrence of values within the source material to determine where in the Huffman tree each symbol value should appear. Huffman coding also offers an advantage, in that it generates prefix free codes, sometimes called prefix codes; that is, no symbol generated by a Huffman tree will correspond to a prefix of any other symbol generated by that Huffman tree.

Huffman coding is used extensively throughout media applications, and in particular in the Joint Photographic Experts Group (JPEG) image file format. Every JPEG uses Huffman coding to compress data, and, correspondingly, every JPEG viewer must process the Huffman coding to decompress the image. The more efficiently a JPEG viewer can process Huffman coding, the faster the decoding process.

The JPEG standard allows for different Huffman tables for every image. The frequency of occurrence of every value in the image is determined, and those frequencies are used to generate unique Huffman tables for that image. As such, in order for a viewer to decode a JPEG image, the necessary information to reconstruct the Huffman tables is included in the file itself, as part of the file header.

SUMMARY

An approach to decoding variable length code (VLC) symbols is described. In one embodiment, a method of decoding VLC symbols is detailed. This method involves obtaining a bitstream sample from a bitstream, and comparing the bitstream sample against a threshold value, to obtain a VLC group number. Information associated with a VLC group is retrieved, using this VLC group number. The current VLC symbol is extracted from the bitstream, using the VLC group information, and the corresponding symbol value is obtained, using the current VLC symbol and the VLC group information.

Another embodiment describes a system for decoding VLC symbols in a media file. The system includes a controller module, for performing operations on the media file. A VLC table module is coupled to the controller module, and is used to retrieve a base table and secondary table from a storage device. A bitstream buffer, also coupled to the controller module, is used to store a data excerpt from the media data included in the file. A number of threshold comparators are used to identify a VLC group corresponding to a current VLC symbol. The controller module obtains group information associated with the VLC group from the base table, and uses this group information to obtain a symbol value corresponding to the current VLC symbol.

A further embodiment is described, involving a method of decoding variable length code symbols and media file. This method involves scanning a number of bits from a bitstream associated with the media file into a bitstream buffer. A VLC group corresponding to a current VLC symbol stored in the bitstream buffer is identified. Group information associated with the VLC group is retrieved from a base table. A symbol value for the current VLC symbol is obtained from a secondary table, with reference to the group information.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2 depicts an exemplary Huffman table, in accordance with one embodiment.

FIG. 4 depicts a base table, in accordance with one embodiment.

FIG. 5 depicts a secondary table, in accordance with one embodiment.

FIG. 10 is an exemplary Huffman table for the AAC codebook book1.

FIG. 11A is an exemplary Huffman table for the MP3 codebook 2tuple7.

FIG. 11B is a Huffman table for the MP3 codebook 2tuple7, in accordance with one embodiment.

FIG. 12 is a base table derived from the MP3 codebook 2tuple7, in accordance with one embodiment.

FIG. 13 is a secondary table derived from the MP3 codebook 2tuple, in accordance with one embodiment.

DETAILED DESCRIPTION

Figure 1:
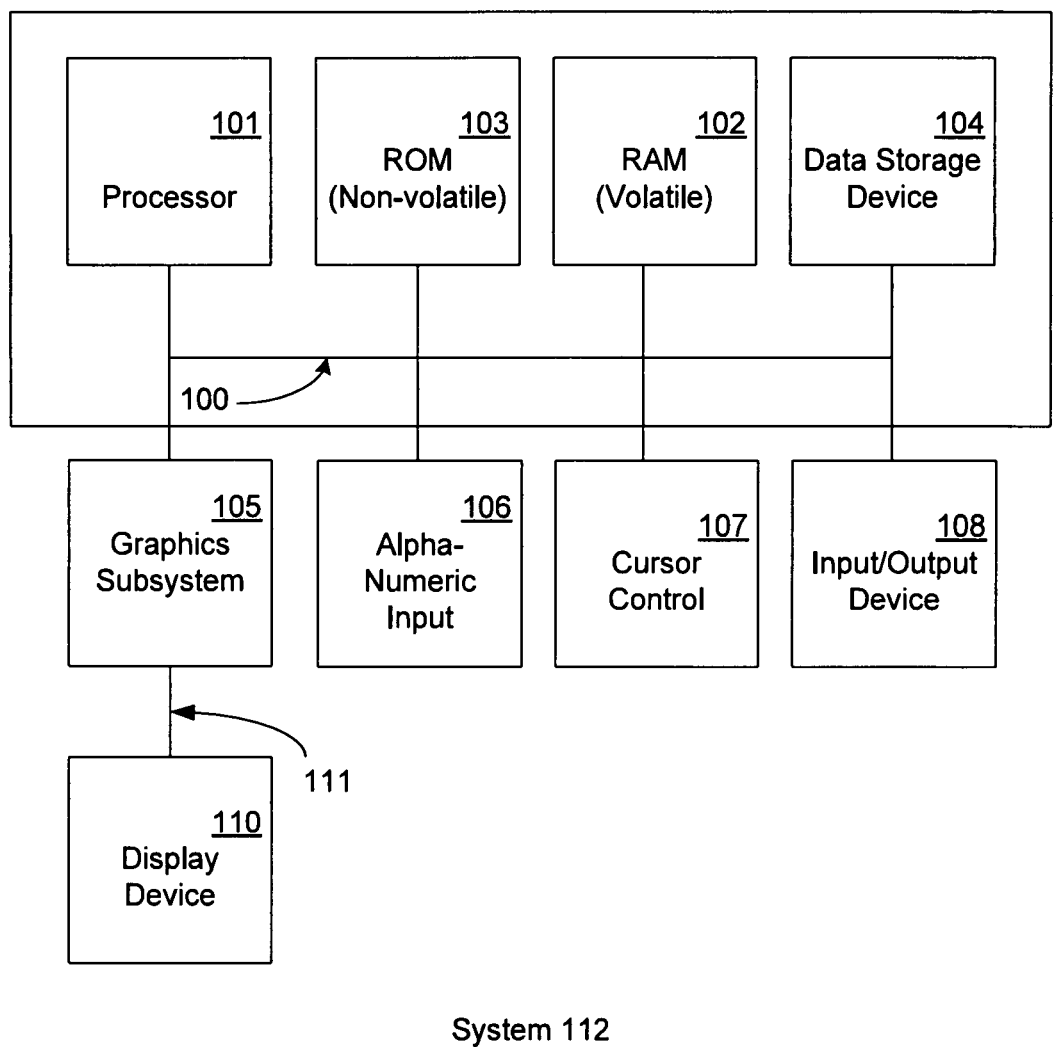
FIG. 1 is a block diagram of an exemplary computer system upon which embodiments of the present invention may be implemented.

Reference will now be made in detail to several embodiments of the invention. While the invention will be described in conjunction with the alternative embodiment(s), it will be understood that they are not intended to limit the invention to these embodiments. On the contrary, the invention is intended to cover alternative, modifications, and equivalents, which may be included within the spirit and scope of the invention as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in figures herein (e.g., FIG. 5) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computing devices typically include at least some form of computer readable media. Computer readable media can be any available media that can be accessed by a computing device. By way of example, and not limitation, computer readable medium may comprise computer storage media and communication media. Computer storage media includes volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, or any other medium which can be used to store the desired information and which can be accessed by a computing device. Communication media typically embodies computer readable instructions, data structures, program modules, or other data in a modulated data signals such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

Some embodiments may be described in the general context of computer-executable instructions, such as program modules, executed by one or more computers or other devices. Generally, program modules include routines, programs, objects, components, data structures, etc,. that perform particular tasks or implement particular abstract data types. Typically the functionality of the program modules may be combined or distributed as desired in various embodiments.

Although embodiments described herein may make reference to a CPU and a GPU as discrete components of a computer system, those skilled in the art will recognize that a CPU and a GPU can be integrated into a single device, and a CPU and GPU may share various resources such as instruction logic, buffers, functional units and so on; or separate resources may be provided for graphics and general-purpose operations. Accordingly, any or all of the circuits and/or functionality described herein as being associated with GPU could also be implemented in and performed by a suitably configured CPU.

Further, while embodiments described herein may make reference to a GPU, it is to be understood that the circuits and/or functionality described herein could also be implemented in other types of processors, such as general-purpose or other special-purpose coprocessors, or within a CPU.

Basic Computing System

Referring now to FIG. 1, a block diagram of an exemplary computer system 112 is shown. It is appreciated that computer system 112 described herein illustrates an exemplary configuration of an operational platform upon which embodiments may be implemented to advantage. Nevertheless, other computer systems with differing configurations can also be used in place of computer system 112 within the scope of the present invention. That is, computer system 112 can include elements other than those described in conjunction with FIG. 1. Moreover, embodiments may be practiced on any system which can be configured to enable it, not just computer systems like computer system 112. It is understood that embodiments can be practiced on many different types of computer system 112. System 112 can be implemented as, for example, a desktop computer system or server computer system having a powerful general-purpose CPU coupled to a dedicated graphics rendering GPU. In such an embodiment, components can be included that add peripheral buses, specialized audio/video components, IO devices, and the like.

Similarly, system 112 can be implemented as a handheld device (e.g., cellphone, etc.) or a set-top video game console device such as, for example, the Xbox®, available from Microsoft Corporation of Redmond, Wash., or the PlayStation3®, available from Sony Computer Entertainment Corporation of Tokyo, Japan. System 112 can also be implemented as a "system on a chip", where the electronics (e.g., the components 101, 103, 105, 106, and the like) of a computing device are wholly contained within a single integrated circuit die. Examples include a hand-held instrument with a display, a car navigation system, a portable entertainment system, and the like.

Computer system 112 comprises an address/data bus 100 for communicating information, a central processor 101 coupled with bus 100 for processing information and instructions; a volatile memory unit 102 (e.g., random access memory [RAM], static RAM, dynamic RAM, etc.) coupled with bus 100 for storing information and instructions for central processor 101; and a non-volatile memory unit 103 (e.g., read only memory [ROM], programmable ROM, flash memory, etc.) coupled with bus 100 for storing static information and instructions for processor 101. Moreover, computer system 112 also comprises a data storage device 104 (e.g., hard disk drive) for storing information and instructions.

Computer system 112 also comprises an optional graphics subsystem 105, an optional alphanumeric input device 106, an optional cursor control or directing device 107, and signal communication interface (input/output device) 108. Optional alphanumeric input device 106 can communicate information and command selections to central processor 101. Optional cursor control or directing device 107 is coupled to bus 100 for communicating user input information and command selections to central processor 101. Signal communication interface (input/output device) 108, which is also coupled to bus 100, can be a serial port. Communication interface 108 may also include wireless communication mechanisms. Using communication interface 108, computer system 112 can be communicatively coupled to other computer systems over a communication network such as the Internet or an intranet (e.g., a local area network), or can receive data (e.g., a digital television signal). Computer system 112 may also comprise graphics subsystem 105 for presenting information to the computer user, e.g., by displaying information on an attached display device 110, connected by a video cable 111. In some embodiments, graphics subsystem 105 is incorporated into central processor 101. In other embodiments, graphics subsystem 105 is a separate, discrete component. In other embodiments, graphics subsystem 105 is incorporated into another component. In other embodiments, graphics subsystem 105 is included in system 112 in other ways.

Efficient VLC Handling in JPEG Applications

In the following embodiment, an approach is described for efficiently handling variable length coding (VLC), and particularly Huffman coding, in JPEG image viewing applications. In one embodiment, a method for processing Huffman codes in a JPEG image is described, which involves efficiently extracting a VLC symbol from a JPEG bitstream, and matching the VLC symbol with its corresponding symbol value.

Several of the embodiments described herein take advantage of several features of the JPEG file format, and its corresponding use of Huffman tables. First, the maximum length Huffman code allowed for a JPEG image is 16 bits. Second, every Huffman table used with JPEG image defines 16 Huffman groups, where a group is defined by the length of the symbols within the group; e.g., the first group consists of symbols one bit in length, the second group consists of symbols two bits in length, and so on, up to the 16th group, which consists of symbols 16 bits in length. Third, as noted previously, Huffman codes are prefix free codes. Fourth, within each Huffman group, code values are consecutive. Utilization of these features allows for an efficient approach to handling Huffman coding.

Exemplary Huffman Codes

While the JPEG standard allows for every image to have its own, uniquely calculated Huffman tables, several "typical" tables are provided by the JPEG committee. One such typical table is the DC luminance table specified by the arrays depicted below, in Table 1.

TABLE 1 dc_luminance_bits[] = {0, 1, 5, 1, 1, 1, 1, 1, 1, 0, 0, 0, 0, 0, 0, 0 }
dc_luminance_val[] = {0, 1, 2, 3, 4, 5, 6, 7, 8, 9, 10, 11 }

The first array, dc_luminance_bits[ ], specifies how the Huffman codes are assigned in the corresponding table, by indicating how many symbols are present in each of the 16 Huffman groups used by JPEG. In this table, only groups two through nine, corresponding to symbols between two and nine bits in length, have entries. Group 3, made up of symbols three bits in length, has five symbols; the remainder have one each. Groups 1 and 10-16 are defined as each having zero entries.

The second array, dc_luminance_val[ ], provides the values to be associated with the symbols, in the order they are to be assigned. In this table, 0 is associated with the first symbol, 1 with the second, and so on.

With reference now to FIG. 2, an exemplary Huffman table 200 is provided. Huffman table 200, as shown, corresponds to the DC luminance table defined by Table 1. The left column consists of the Huffman symbols specified by the dc_luminance_bits[ ] array, symbols 201, 203, 205, 207, 209, 211, 213, 215, 217, 219, 221, and 223. The right column consists of the values associated with the symbols by the dc_luminance_val[ ] array, symbol values 202, 204, 206, 208, 210, 212, 214, 216, 218, 220, 222, and 224. As noted previously, Huffman codes are prefix free codes; when depicted left justified, as shown in FIG. 2, it is easy to see that no symbol is identical to the prefix of another symbol; e.g., symbol 201 is 00, and no other symbol begins with 00.

JPEG File Format

Figure 3:
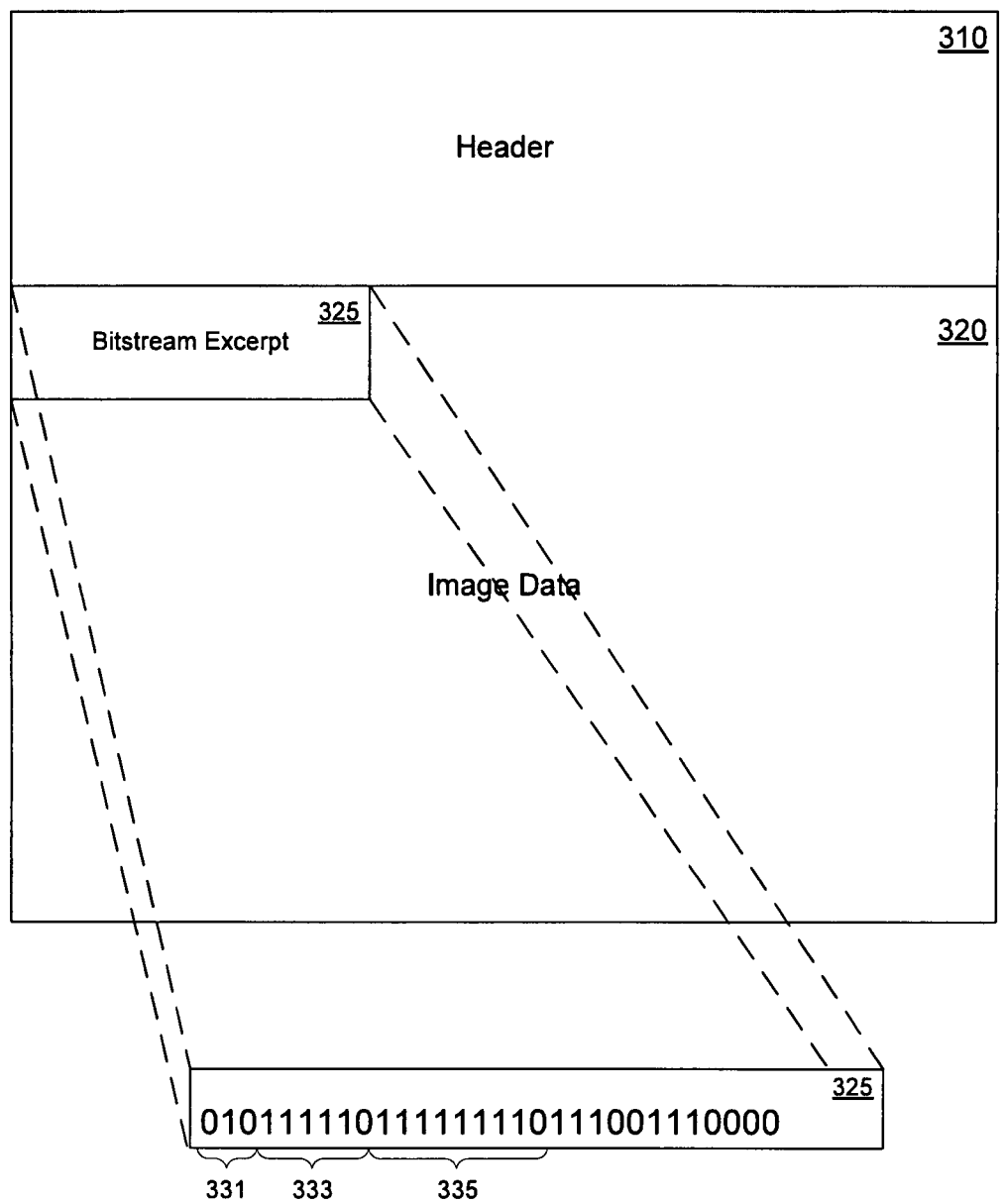
FIG. 3 is a depiction of a JPEG image file, in accordance with one embodiment.

With reference now to FIG. 3, a depiction of a JPEG image file 300 is shown, in accordance with one embodiment. As shown, JPEG image file 300 consists of two sections: a header 310; and the image data 320. Header 310 includes information necessary to decode the image contained in JPEG image file 300, while image data 320 includes the actual compressed image data. For example, header 310 may include an initial sequence, identifying JPEG image file 300 as being a JPEG image file, as well as a section containing Huffman table information for JPEG image file 300, such as the arrays presented in Table 1.

Image data 320, as shown, consists of a bitstream of compressed symbol data. An exemplary excerpt of this bitstream data is shown as bitstream excerpt 325. Bitstream excerpt 325, in the depicted embodiment, is made up of several VLC symbols strung together, e.g., symbols 331, 333, and 335. Because the symbols are variable in length, it is necessary for a JPEG viewer to recognize each complete symbol, regardless of length.

Traditional Approaches

A common prior art approach to handling Huffman codes in JPEG image files involved reading in several bits from the bitstream, often three, and comparing those bits with a table stored in memory. If those bits constituted a complete symbol, the table would so indicate, and provide the value associated with the symbol. If those bits were not a complete symbol, the table would indicate that as well, and include a reference to another table. Further bits would be read from the bitstream, and the second table referenced, with the same potential results. This repeated looping cycle is inefficient, in terms of processing time, repeated memory accesses, and usage of memory to store multiple tables for all but the most trivial of cases.

The Base Table and the Secondary Table

The following embodiments describe an approach for more efficient Huffman decoding for JPEG images. One feature of this approach is more efficient utilization of memory, by limiting the usage of memory tables. For all but the most trivial of cases, the use of the base and secondary tables represents a substantial improvement in terms of memory usage.

With reference to FIG. 4, a base table 400 is depicted, in accordance with one embodiment. Base table 400 is derived from the DC luminance "typical" table information shown above, in Table 1. Base table 400 is broken up into 16 groups, corresponding to the 16 Huffman groups defined by the JPEG standard. Each group contains three pieces of information: nbits, which corresponds to the length of entries, in bits, in a particular group; threshold, which corresponds, in the depicted embodiment, to the lowest value of an entry in that group; and offset, which is a memory pointer to a position in the secondary table, where the symbol values for entries in that group are stored. As discussed above, only groups two through nine have entries in the DC luminance typical table.

The threshold values depicted in base table 400 have been "padded" with zeroes, in order to fill them out to 16 bits in length. In some embodiments, as described in greater detail below, it is advantageous for the threshold values to be equally long, e.g., as long as the longest possible Huffman code.

With reference to FIG. 5, a secondary table 500 is depicted, in accordance with one embodiment. Secondary table 500, in the depicted embodiment, is derived from the DC luminance "typical" table information shown above, in Table 1. Secondary table 500 is a listing of symbol values, corresponding to the Huffman symbols encoded in a JPEG bitstream. In some embodiments, these values are stored sequentially in memory, such that any particular entry can be retrieved, with a combination of an offset value and an index. For example, if secondary table 500 begins at memory address <Table 2 Address>, as indicated, using <Table 2 Address> as an offset, and <2*value_length> (where value_length corresponds to the length, in bytes, of an entry in the secondary table) as an index would retrieve the third symbol value stored in secondary table 500.

Decoding Huffman Values for JPEG Images

Figure 6:
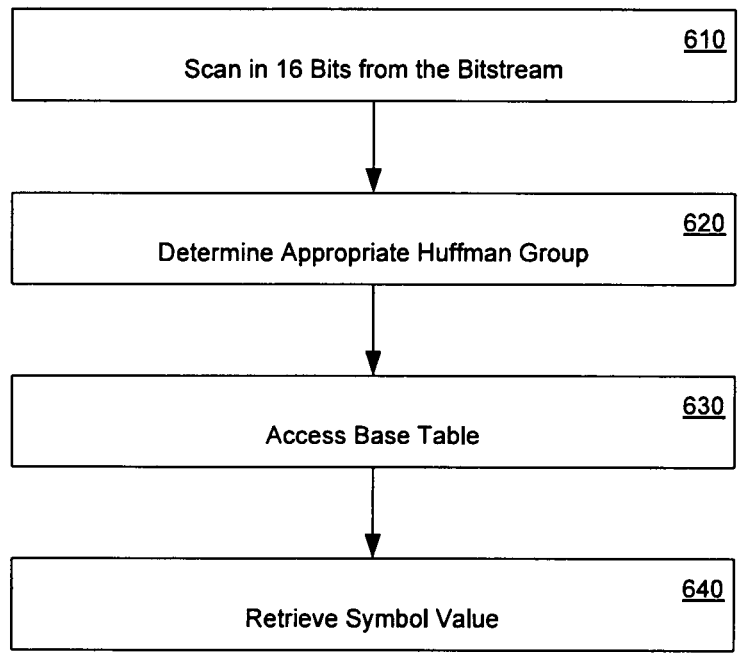
FIG. 6 is a flowchart of a method of decoding Huffman codes in JPEG image files, in accordance with one embodiment.

With reference now to FIG. 6, a flowchart 600 of a method of decoding Huffman codes in JPEG image files is depicted, in accordance with one embodiment. Although specific steps are disclosed in flowchart 600, such steps are exemplary. That is, embodiments of the present invention are well suited to performing various other (additional) steps or variations of the steps recited in flowchart 600. It is appreciated that the steps in flowchart 600 may be performed in an order different than presented, and that not all of the steps in flowchart 600 may be performed.

As shown, step 610 involves scanning in 16 bits from the bitstream. In this embodiment, the maximum possible length of a VLC code is 16 bits. Accordingly, this single scan operation is certain to retrieve a complete symbol from the bitstream. In some embodiment, these bits are placed into a bitstream buffer.

Step 620, in the depicted embodiment, involves determining the appropriate Huffman group for the first symbol in the bitstream buffer. As discussed previously, Huffman codes are prefix free codes. As such, identifying the group in which a particular Huffman symbol belongs will indicate also how many bits long the symbol is. In one approach, the bitstream buffer is compared against 16 different threshold values, each associated with one of the 16 possible Huffman groups used in JPEG encoding. This comparison, which can happen in parallel and very quickly, makes determining the appropriate group, and then the symbol itself, straightforward.

With reference now to step 630, a base table is accessed, and symbol information is retrieved. In some embodiments, two tables are utilized in decoding Huffman symbols. The first table, or base table, contains information about the 16 Huffman groups used in JPEG encoding. In one such embodiment, a "base triplet" is used for each of these 16 groups. The triplet contains the length of entries in that group, e.g., in numbers of bits; a threshold value for that group, which may be used for the comparison performed in step 620; and a memory offset, pointing to a portion of a second memory table where entries for that group may begin. The second table contains symbol values for the various Huffman symbols encoded in the bitstream.

With reference now to step 640, a corresponding symbol value is retrieved. In some embodiments, the base table provides the appropriate offset information for accessing the secondary table. The symbol itself can then be used to provide an index, which, in combination with the offset, allows retrieving a particular symbol value from its location in the secondary table.

Figure 7:
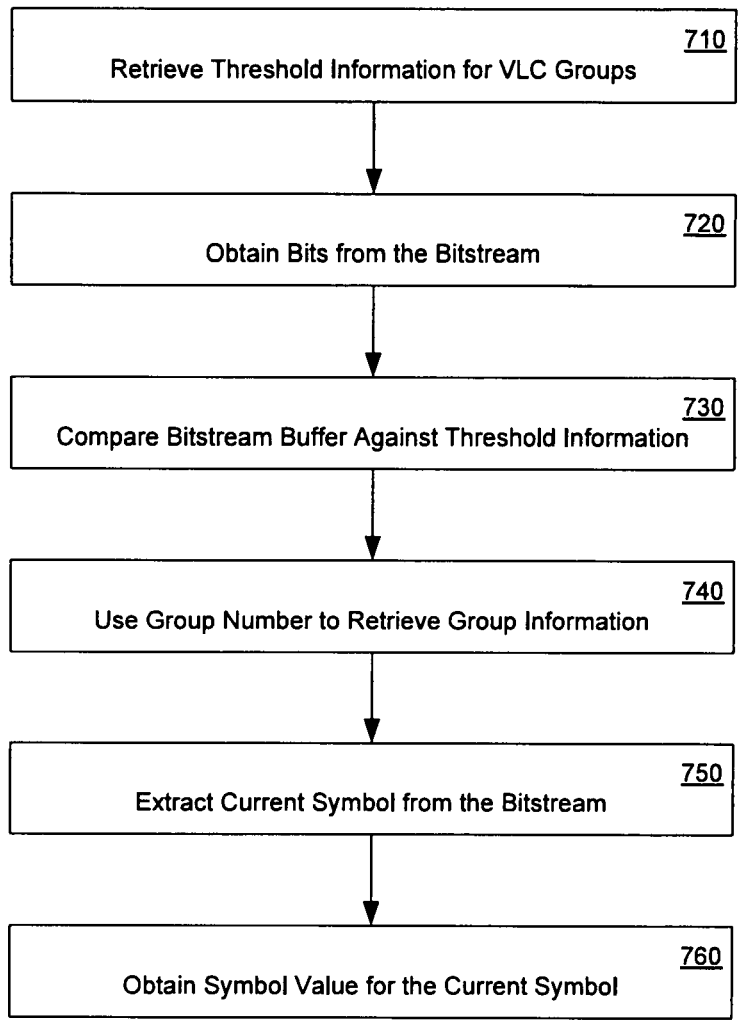
FIG. 7 is a flowchart of a method of decoding a variable length code (VLC) symbol, in accordance with one embodiment.

With reference now to FIG. 7, a flowchart 700 of a method of decoding a variable length code (VLC) symbol is depicted, in accordance with one embodiment. Although specific steps are disclosed in flowchart 700, such steps are exemplary. That is, embodiments of the present invention are well suited to performing various other (additional) steps or variations of the steps recited in flowchart 700. It is appreciated that the steps in flowchart 700 may be performed in an order different than presented, and that not all of the steps in flowchart 700 may be performed.

With reference to step 710, threshold information is retrieved for the VLC groups used during encoding. In some embodiments, this threshold information is obtained from a base table, such as described above with reference to FIG. 4. The threshold information for a given group, in some embodiments, consists of the lowest value of an entry in that group. Further, in some embodiments, the threshold value for a particular group may be "filled" or "padded", such that all thresholds are of equal length.

With reference to step 720, a bitstream is accessed, and a number of bits are obtained from the bitstream. For JPEG bitstreams, the maximum possible VLC symbol length is 16 bits; accordingly, during step 720, 16 bits are obtained from the bitstream, and stored in a bitstream buffer. In different embodiments, different approaches are utilized for obtaining bits. For example, in one embodiment, the bitstream is scanned initially to obtain these 16 bits, while in other embodiments, the bits may be read from the bitstream.

With reference now to step 730, the bitstream buffer is compared against the threshold information, to determine which VLC group the current symbol belongs to. In different embodiments, this step is performed in different ways. In one embodiment, for example, the value stored in the bitstream buffer is compared against the threshold value for each group; if the bitstream buffer is greater than the threshold value for a particular group, the comparison returns "true." Adding up the number of true results will give the group number for the current symbol. In some embodiments, the threshold value for the first VLC group need not be compared against the bitstream buffer; in such an embodiment, every possible value of the bitstream buffer will be equal to or greater than the threshold for the first VLC group.

With reference now to step 740, the group number is used to retrieve group information. In some embodiments, the group number serves as an index to the base table. The base table, in turn, contains information regarding the number of bits in length a symbol in a particular group will be, a threshold value corresponding to the smallest entry in that particular group, and a memory offset for a location in a secondary table, where the symbol values for entries in that group are stored.

With reference now to step 750, the current symbol is extracted from the bitstream. In some embodiments, this step is performed by reading the number of bits indicated by the base table from the bitstream. In other embodiments, e.g., where step 720 involves a "read" operation instead of a "scan" operation, this step may be performed by reading a number of bits indicated by the base table from the bitstream buffer.

With reference now to step 760, the symbol value corresponding to the current symbol is obtained. In some embodiments, the symbol values are stored in a secondary table. In one such embodiment, an index to the secondary table is calculated by using the current symbol, the threshold value for their group, and the offset value for the group. An example of such a calculation is depicted below, in Table 2.

TABLE 2 index = symbol − (threshold >> nBits) + offset

Exemplary VLC Decoding

With reference to FIGS. 8A through 8D, an exemplary VLC decoding process is depicted, in accordance with one embodiment. FIGS. 8A through 8D show operations on a bitstream 825, in accordance with the method of flowchart 700.

Figure 8A:
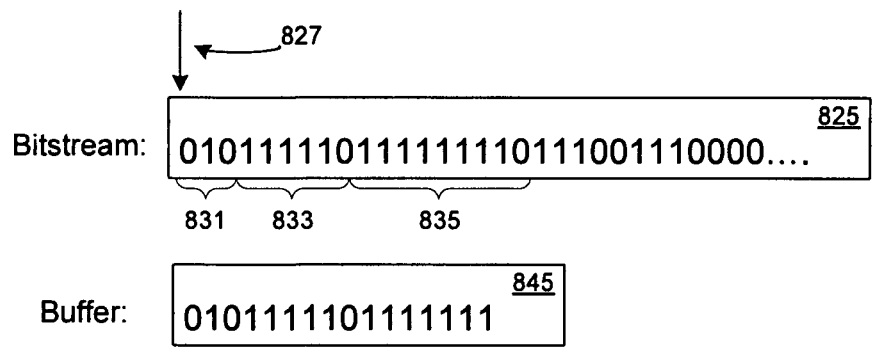
FIGS. 8A, 8B, 8C, and 8D depicts an exemplary VLC decoding process on a bitstream, in accordance with one embodiment.

As shown in FIG. 8A, bitstream 825 is made up of several variable length symbols strung together. The first 16 bits of bitstream 825 are scanned into a buffer 845. In the depicted embodiment, because a scan operation has been used, bitstream memory pointer 827 is not moved. In another embodiment, e.g., where a read operation is used, bitstream memory pointer 827 may move to the end of the accessed portion of the bitstream.

The contents of buffer 845 are then compared with a number of threshold values, e.g., the threshold values depicted in base table 400: threshold values 432 through 439. Every comparison where buffer 845 is greater than or equal to the threshold value returns 1 (true). Note that in the depicted embodiment, as previously described, it is not necessary to compare the buffer against the threshold for group 1; in this embodiment, every possible value of buffer 845 is greater than the threshold for group 1, and so this comparison is automatically treated as 1.

The sum of these true results indicates the VLC group for the current symbol. In the embodiment depicted in FIG. 8A, buffer 845 is greater than threshold values 432 and 433, but less than threshold value 434; as such, the current symbol is in VLC group 3.

The VLC group is used to address the base table, e.g., base table 400, and retrieve the appropriate base triplet; in the depicted embodiment, the base triplet is made up of nbit value 423, threshold 433, and offset 443.

Figure 8B:
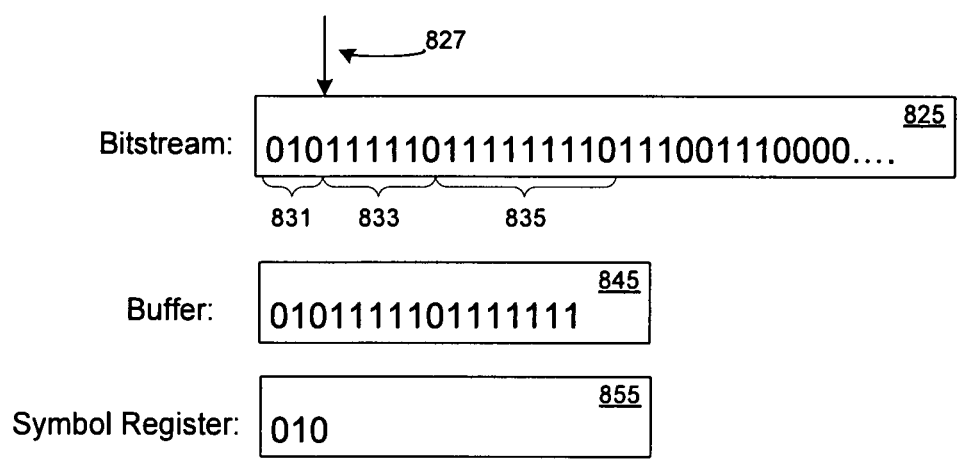

As shown in FIG. 8B, the current symbol is read from bitstream 825, and stored in symbol register 855. The base triplet, and specifically nbit value 423, indicated that the current symbol, symbol 831, was three bits in length. Accordingly, the first three bits of bitstream 825 are read into memory. Because the depicted embodiment involves a read operation, bitstream pointer 827 advances to a position at the end of the read operation. In another embodiment, symbol 831 may be retrieved from buffer 845, rather than bitstream 825. In one such embodiment, a flush operation is used to move bitstream pointer 827.

Symbol 831, in combination with threshold value 433 and offset 443, is used to address secondary table 500. Offset 443 indicates the starting position within secondary table 500 for entries in group 3; symbol 831, in combination with threshold value 433, provides an index value. In the depicted embodiment, symbol 831 corresponds to the first entry in group 3, and its symbol value is stored at memory position <T2addr+1>. The symbol value for symbol 831 is 1.

Figure 8C:
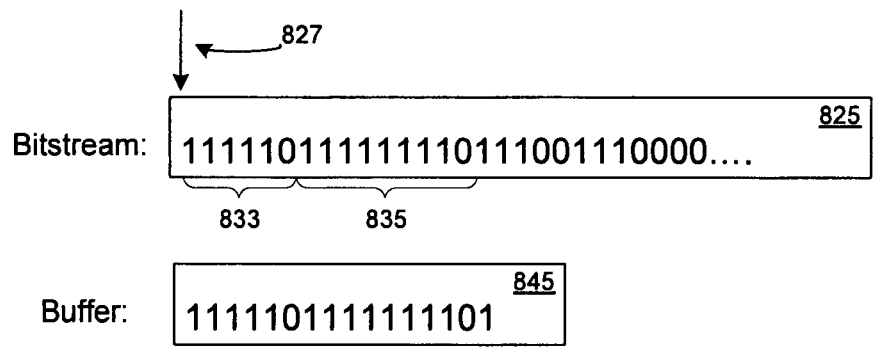
Figure 8D:
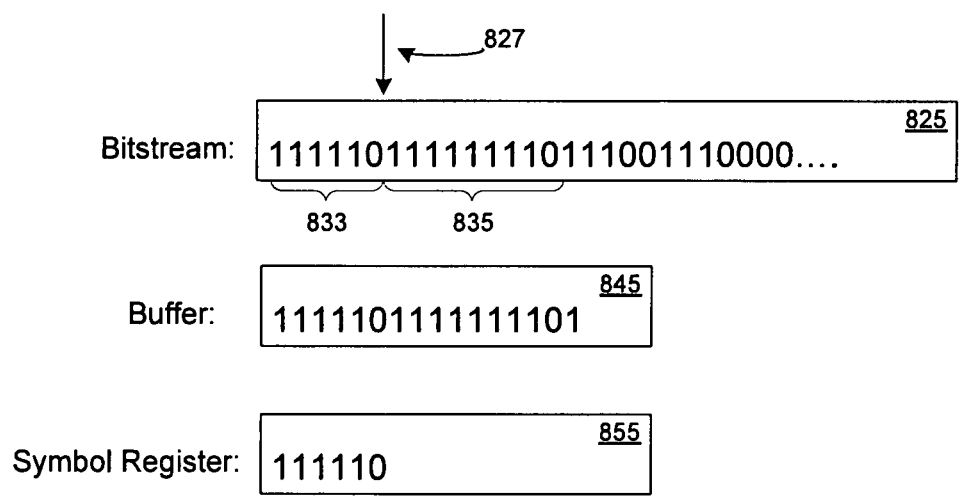

As shown in FIG. 8C, when decoding the next VLC symbol in bitstream 825, e.g., symbol 833, a similar process is followed: the first 16 bits of bitstream 825 are scanned into buffer 845, and compared against the threshold values, as shown in base table 400. This comparison indicates that the current symbol is a member of group 6, and is six bits in length. The first six bits are then read into symbol register 855, as shown in FIG. 8D, and bitstream pointer 827 advances to the end of symbol 833. Using the base triplet associated with group 6, e.g., nbit value 426, threshold 436, and offset 446, an index is calculated for secondary table 500, and the corresponding symbol value, 8, is retrieved.

System for JPEG Decoding

Figure 9:
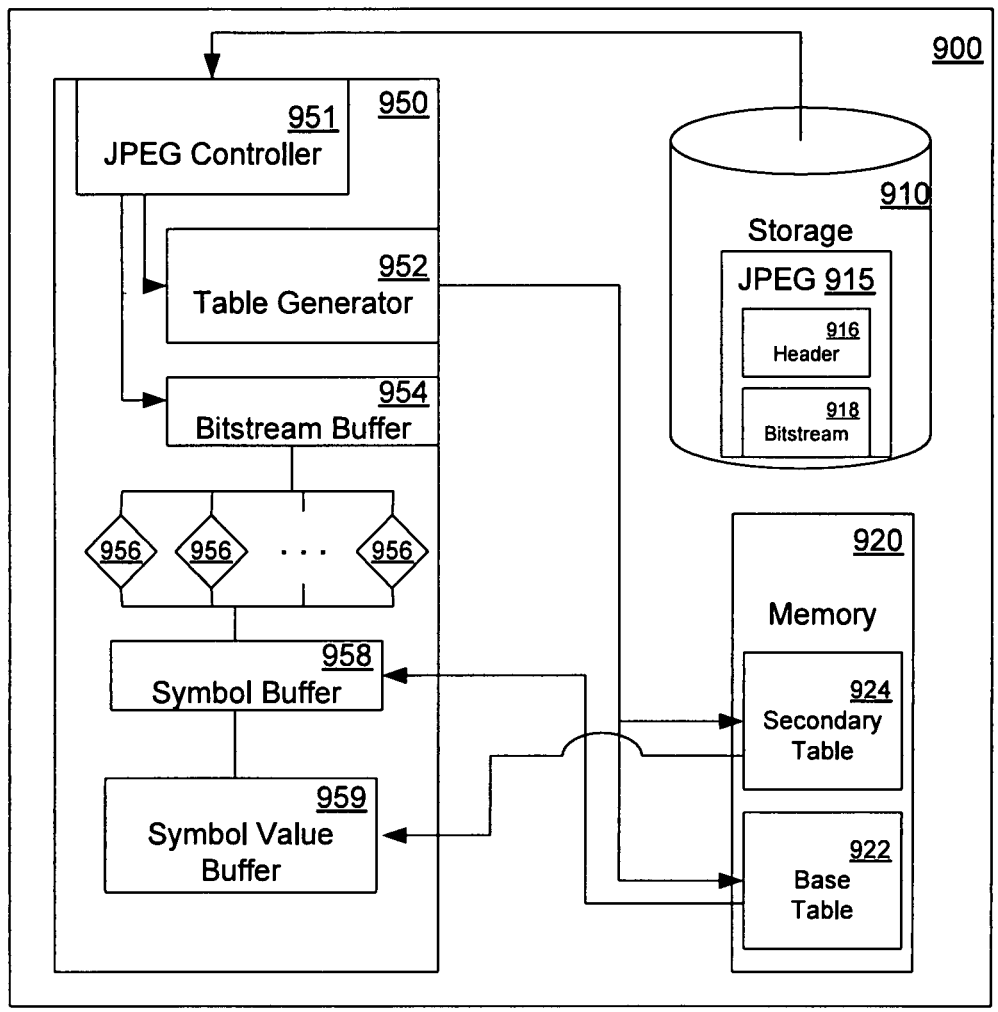
FIG. 9 is a block diagram of a system for JPEG decoding, in accordance with one embodiment.

With reference now to FIG. 9, a system 900 for JPEG decoding is depicted, in accordance with one embodiment. While system 900 is shown as incorporating specific, enumerated features and elements, it is understood that other embodiments are well suited to applications involving additional, fewer, or different features, elements, or arrangements. Moreover, is understood that system 900 may be implemented in hardware, e.g., through use of dedicated electronic components, through software, e.g., as a collection of programmatic modules, or as a combination of these.

System 900 is shown as incorporating storage element 910. Storage element 910 may take different forms, in different embodiments. For example, in one embodiment, storage element 910 is a magnetic hard disk drive. In the depicted embodiment, storage element 910 is shown as storing JPEG file 915. JPEG file 915, as shown, incorporates both header 916, and bitstream 918.

System 900 is also shown as including memory 920. In different embodiments, memory 920 may take different forms. Memory 920, in the depicted embodiment, is used to store base table 922, and secondary table 924.

System 900 is also shown as including JPEG decoding engine 950. In the depicted embodiment, JPEG decoding engine 950 incorporates JPEG controller module 951, Huffman table generator 952, bitstream buffer 954, a plurality of threshold comparators 956, symbol buffer 958, and symbol value buffer 959.

Operation of system 900, according to the depicted embodiment, involves passing JPEG file 915 to JPEG decoding engine 950, where it is received by JPEG controller module 951. Header 916 is passed to Huffman table generator 952, which uses information contained in header 916, e.g., Huffman table information encoded as part of JPEG file 915, to generate base table 922 and secondary table 924. JPEG controller module 951 accesses base table 922, and obtains threshold information for each Huffman group described therein. This threshold information is loaded into the plurality of threshold comparators 956.

A portion of bitstream 918, e.g., the first 16 bits, is loaded into bitstream buffer 954. The contents of bitstream buffer 954 are then compared with each threshold comparator 956; the results of these comparisons will identify the Huffman group of the current symbol. Once the appropriate Huffman group has been determined, group information can be obtained from base table 922. This group information, in turn, allows for the extraction of the current symbol from bitstream 918; the symbol is stored in symbol buffer 958.

The combination of the group information and the symbol is used to access secondary table 924 and extract the symbol value for the current symbol, which can then be stored in symbol value buffer 959.

Decoding Non-JPEG Variable Length Codes

In some embodiments, the approach described above can be modified to handle other VLC use cases, such as other multimedia formats. VLC, and especially Huffman coding, are used across a wide variety of computer applications. Most media compression schemes, for example, use Huffman coding to aid in compression. The AAC, MP3, MPEG, VC1, and H.264 media formats all use Huffman coding, for example.

Unlike JPEG, many multimedia formats use fixed Huffman tables, rather than allowing new Huffman tables to be generated based on the content. Given that these Huffman tables are fixed, the base and secondary tables can be "hard-coded" into the decoding engine. However, these formats do not all incorporate a useful feature of the JPEG standard; while in JPEG, the number of VLC or Huffman groups corresponded directly to the bit length of entries within that group, in other standards, such a rule does not necessarily apply.

Table 3, below, provides several examples of media formats which incorporate Huffman coding. Table 3 also depicts exemplary relationships between numbers of VLC groups and the maximum bit lengths of symbols for one Huffman table associated with each of these media formats. As indicated, one AAC Huffman table describes six Huffman groups, but has a maximum bit length of 11 for some symbols within those groups. Meanwhile, the exemplary VC1 Huffman table describes 117 Huffman groups, but with a maximum bit length of 15. As is explained in greater detail below, some embodiments seek to limit the number of entries in the base table, e.g., to reduce implementation costs, or to conserve memory.

TABLE 3

| Format: | VLC Groups (NB): | Max Length: |
|---|---|---|
| JPEG | 16 | 16 |
| AAC codebook book 1 | 6 | 11 |
| MP3 codebook 2tuple7 | 16 | 10 |
| VLC codebook ac_intra_highmotion | 117 | 15 |

Accordingly, embodiments which support decoding variable length codes in other applications may incorporate several modifications to the previously described approach. Several such embodiments are detailed below.

Exemplary Huffman Tables

With reference now to FIG. 10, an exemplary Huffman table 1000 for the AAC standard is presented. Huffman table 1000 corresponds to the AAC codebook book1. As indicated above, in Table 3, in this AAC codebook has a total of six VLC code groups (NB=6), with a maximum symbol length of 11 bits. Like the JPEG tables earlier described, VLC code length increases as the left justified VLC value increases.

With reference now to FIG. 11A, an exemplary Huffman table 1100 for the MP3 codebook 2tuple7 is presented. As indicated above, in Table 3, this MP3 codebook has a total of 16 VLC code groups (NB=16), with a maximum symbol length of 10 bits. Unlike both the AAC and JPEG tables discussed previously, the overall VLC code length generally decreases as the left justified VLC value increases. Moreover, several locations within Huffman table 1100 are exceptions to this trend, e.g., where the symbol length decreases, and then increases again. Exceptions such as these complicate the application of the method applied to JPEG tables, in that they require additional entries in the base table, which results in increasing amounts of memory utilized. The VC1 Huffman table described above in Table 3 offers an extreme example, as a base table for that Huffman table might require 117 separate entries.

In some embodiments, the overall number of VLC groups can be reduced. One such embodiment utilizes expanded entries, in order to reduce the number of Huffman groups that need to be included in the base table. FIG. 11B depicts an exemplary approach, using the MP3 codebook table presented in FIG. 11A.

Expanded Symbols

With reference now to FIG. 11B, a Huffman table 1101 is depicted, in accordance with one embodiment. Huffman table 1101 has had several entries "expanded", in order to reduce the number of VLC groups needed. Huffman table 1101 has been divided into eight VLC groups, groups 1110, 1120, 1130, 1140, 1150, 1160, 1170, and 1180. Each of these VLC groups contains symbols of the same length, e.g., number of bits. However, in order to create these groups, several entries from the original table, Huffman table 1100, have been expanded in order to reduce the number of Huffman groups needed. In this embodiment, expanding or "padding" entries involves adding bits to these shorter entries, in order to make them equivalent in length to the other entries in their VLC group. For example, the original entry 00000011 (8 bits in length) is shown as part of group 1120, whose entries have 9 bits. This entry was therefore expanded, to make it 9 bits in length. However, in this embodiment, all potential permutations should be accounted for; as such, entries 1121 and 1122 replace the original entry, with a terminal zero or one bit added, respectively. Similar operations were performed on pairs 1123 and 1124, 1125 and 1126, 1131 and 1132, 1133 and 1134, 1135 and 1136, and 1151 and 1152.

While modifying the initial Huffman table in this way allows for creation of a simpler base table, it complicates the secondary table somewhere. As is explained in greater detail below, the secondary table can be modified to include the original length of the VLC symbol, which allows the VLC decoder to extract the appropriate number of bits from the bitstream, even where that symbol has been expanded in the base table.

MP3 Base and Secondary Tables

With reference now to FIG. 12, a base table 1200 is depicted, in accordance with one embodiment. Base table 1200 is derived from the MP3 codebook 2tuple7 information depicted in FIGS. 11A and 11B. In particular, base table 1200 is derived from Huffman table 1101, containing the "expanded" entries and reduced VLC groups. Base table 1200 is therefore broken up into eight groups, corresponding to the eight VLC groups depicted in FIG. 11B. Each group contains three pieces of information: nbits, which corresponds to the length of the (expanded) symbols in the subgroup; threshold, which corresponds to the lowest value of an entry in that group; and offset, which is a memory pointer to a position in the secondary table, where the symbol values for entries in that group are stored.

Some of the threshold values depicted in base table 1200 have been padded with zeros, in order to fill them out to 10 bits in length, the maximum length of a VLC symbol within this table. In some embodiments, as noted previously, it is advantageous for the threshold values to be of equal length, e.g., as long as the longest possible VLC code.

With reference now to FIG. 13, a secondary table 1300 is depicted, in accordance with one embodiment. Secondary table 1300, in the depicted embodiment, is derived from the MP3 codebook 2tuple7 information depicted in FIGS. 11A and 11B. Secondary table 1300 is a listing of symbol values, corresponding to the Huffman symbols encoded in an MP3 bitstream. Moreover, secondary table 1300 also includes code length information, corresponding to the length of the original symbol encoded in the bitstream. This information is utilized, in some embodiments, to offset the expanding or padding of VLC symbols, such as those used to generate the simplified VLC groups used in FIGS. 11B and 12.

Because several of the entries in Huffman table 1101 have been padded, secondary table 1300 is depicted as containing more entries than there are unique code/symbol pairings in the original Huffman table 1100, as discussed above with reference to Huffman table 1101.

In some embodiments, e.g., where a VLC code is extended by more than one bit, additional corresponding entries in the secondary table are needed. In such embodiments, a trade-off can be made between base table size and secondary table size, by adjusting how many VLC codes are expanded, and by how many bits they are expanded. For example, an entry which is expanded with two additional bits requires four entries in the secondary table; three additional bits requires eight entries, and so on.

In some embodiments, these values are stored sequentially in memory, such that any particular entry can be retrieved a combination of an offset value and an index. For example, secondary table 1300 begins at memory address <Table 2 Address>, as indicated. Using <Table 2 Address> as an offset and <2*value_length+2*CL_length> as an index (where value_length corresponds to the length, in bytes, of an symbol value entry in the secondary table, and CL_length corresponds to the length, in bytes, of a code length entry in the secondary table) retrieves the third symbol value stored in secondary table 1300.

Decoding Variable Length Codes

Figure 14:
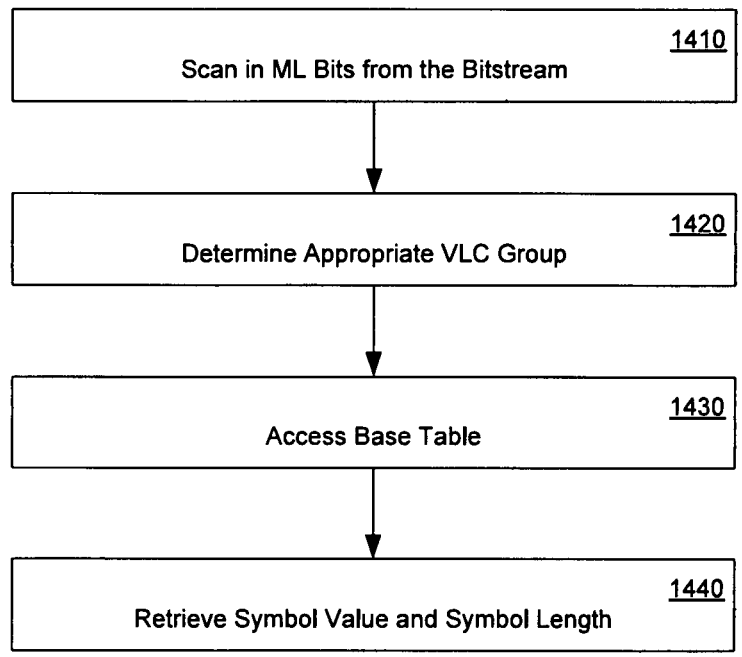
FIG. 14 is a flowchart of a method of decoding variable length codes, in accordance with one embodiment.

With reference now to FIG. 14, a flowchart 1400 of a method of decoding variable length codes is depicted, in accordance with one embodiment. Although specific steps are disclosed in flowchart 1400, such steps are exemplary. That is, embodiments of the present invention are well suited to performing various other (additional) steps or variations of the steps recited in flowchart 1400. It is appreciated that the steps in flowchart 1400 may be performed in an order different than presented, and that not all of the steps in flowchart 1400 may be performed.

In the depicted embodiment, step 1410 involves scanning in a number of bits from the bitstream. In different embodiments, different numbers of bits may be scanned in. In some embodiments, the number of bits scanned in is equivalent to the maximum length of VLC code used in a particular media format. For example, when decoding a JPEG image, 16 bits may be scanned in; when decoding an MP3 file using MP3 codebook 2tuple7, 10 bits are scanned in. Several exemplary combinations of maximum bit length and media format are presented above, in Table 3.

Step 1420, in the depicted embodiment, involves determining the appropriate VLC group for the first symbol in the bitstream buffer. As discussed previously, many VLC codes, and particularly Huffman codes, are prefix free codes. As such, identifying the group in which a particular VLC symbol belongs may also indicate how many bits long the symbol is. In one approach, the bitstream buffer is compared against a number of threshold values, each associated with one of the possible VLC groups used in encoding for this particular media format. This comparison, which can happen in parallel and very quickly, makes determining the appropriate group, and then the symbol itself, straightforward.

With reference now to step 1430, a base table is accessed, and symbol information is retrieved. In some embodiments, two tables are utilized in decoding VLC symbols. The first table, or base table, contains information about VLC groups used in the encoding of a particular media format. In one such embodiment, a "base triplet" is used for each of these groups. The triplet contains the length of entries in that group, e.g., in numbers of bits; a threshold value for that group, which may be used for the comparison performed in step 1420; and a memory offset, pointing to a portion of a second memory table where entries for that group may begin. The second table contains symbol values for the various VLC symbols encoded in the bitstream, and the actual length of the encoded symbols.

With reference now to step 1440, a corresponding symbol value is retrieved. In some embodiments, the base table provides the appropriate offset information for accessing the secondary table. The symbol itself can then be used to provide an index, which, in conjunction with the offset, allows retrieving a particular simple value from its location in the secondary table. The secondary table also contains code length information. In some embodiments, some symbols may be extended, in order to reduce the number of VLC groups in the base table. In order to properly decode the bitstream, these extended symbols need to be identified, such that the appropriate number of bits are flushed from the bitstream.

Figure 15:
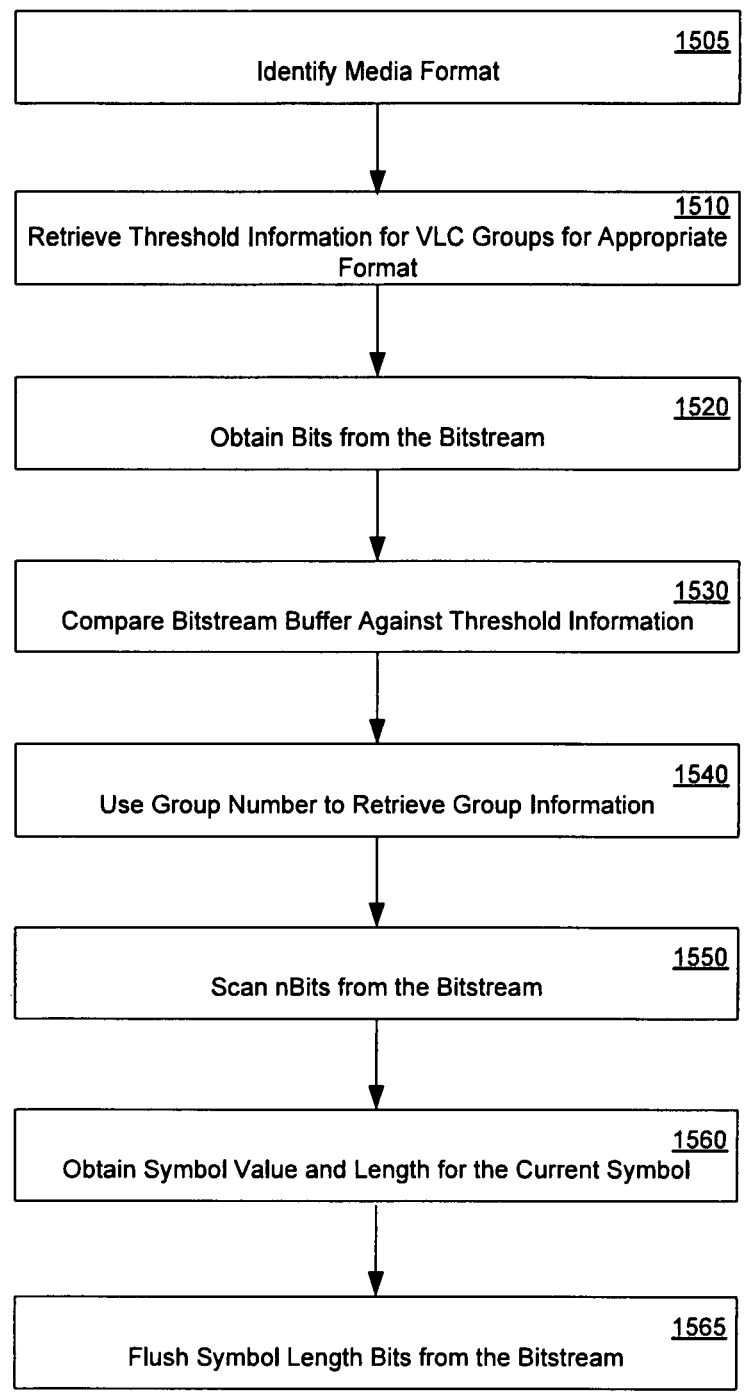
FIG. 15 is a flowchart of a method of decoding a variable length code symbol, in accordance with one embodiment.

With reference now to FIG. 15, a flowchart 1500 of a method of decoding a variable length code (VLC) symbol is depicted, in accordance with one embodiment. Although specific steps are disclosed in flowchart 1500, such steps are exemplary. That is, embodiments of the present invention are well suited to performing various other (additional) steps or variations of the steps recited in flowchart 1500. It is appreciated that the steps in flowchart 1500 may be performed in an order different than presented, and that not all of the steps in flowchart 1500 may be performed.

With reference to step 1505, a media format corresponding to a bitstream is identified. In different embodiments, different media formats are supported, with correspondingly different VLC symbols, Huffman tables, base tables, secondary tables, and other variations. In some embodiments, e.g., where a system can decode several different types of media formats, the current format of a bitstream is identified. In different embodiments, such identification may be performed in different ways. For example, in one embodiment, header information included at the beginning of the bitstream may identify the format of the encoded symbols.

In different embodiments, different actions may be performed after the media format has been identified. For example, in one embodiment, a base table and secondary table may be retrieved from memory or some other storage device, and the decoder configured to decode the corresponding bitstream.

With reference to step 1510, threshold information is retrieved for the VLC groups used during encoding. In some embodiments, this threshold information is obtained from a base table, such as described above with reference to FIG. 12. In some embodiments, the threshold information for a given group consists of the lowest value of an entry in that group. In other embodiments, threshold information may vary. Further, in some embodiments, the threshold value for a particular group may be "filled" or "padded", such that all thresholds are of equal length. In several embodiments, this threshold information is loaded into a series of comparators, for use in combination with step 1530.

With reference to step 1520, the bitstream is accessed, and a number of bits are obtained from the bitstream. In different embodiments, the number of bits retrieved may vary. In some embodiments, the number of bits retrieved is equal to the maximum possible length of a VLC symbol for the current format; for example, for a JPEG bitstream, the maximum possible VLC symbol length is 16 bits, and so 16 bits are obtained from the bitstream; for MP3 codebook 2tuple7, the maximum possible length is 10 bits, and so 10 bits are obtained from the bitstream. In different embodiments, different approaches are utilized for obtaining bits. For example, in one embodiment, the bitstream is scanned initially to obtain these bits, while in other embodiments, the bits may be read from the bitstream.

With reference now to step 1530, the bitstream buffer is compared against the threshold information, to determine which VLC group the current symbol belongs to. In different embodiments, this step is performed in different ways. In one embodiment, for example, the value stored in the bitstream buffer is compared against the threshold value for each group; if the bitstream buffer is greater than the threshold value for particular group, the comparison returns true. The sum of the true results will give the group number for the current symbol. In some embodiments, the threshold value for the first VLC group may not need to be compared against the bitstream buffer; in such an embodiment, every possible value of the bitstream buffer will be equal to or greater than the threshold for the first VLC group.

With reference now to step 1540, the group number is used to retrieve group information. In some embodiments, the group number serves as an index to the base table. The base table, in turn, contains information regarding the length (in bits) a symbol in that particular group will be, a threshold value corresponding to the smallest entry in that particular group, and a memory offset for a location in a secondary table, where the symbol values and code lengths for entries in that group are stored.

With reference now to step 1550, the current symbol is extracted from the bitstream. In some embodiments, this step is performed by scanning the number of bits (nBits) indicated by the base table from the bitstream. In other embodiments, other approaches may be utilized.

With reference now to step 1560, the symbol value corresponding to the current symbol is obtained. In some embodiments, the symbol values are stored in a secondary table. In one such embodiment, an index to the secondary table is calculated by using the current symbol, the threshold value for the corresponding group, and the offset value for the group. An example of such a cancellation is depicted below, in Table 4.

TABLE 4 index = symbol − (threshold >> nBits) + offset

With reference now to step 1565, the current symbol is "flushed." In some embodiments, the current symbol is flushed from the bitstream; in others, the symbol is flushed from the bitstream buffer. In several embodiments, some symbols may have been "expanded", e.g., to reduce the number of VLC groups included in the base table. In one such embodiment, the secondary table also includes information regarding the actual code length of the current symbol. This code length is used to flush the appropriate number of bits, without discarding portions of the following symbol in the bitstream.

Exemplary VLC Decoding of an MP3 Bitstream

With reference now to FIGS. 16A through 16D, an exemplary VLC decoding process is depicted, in accordance with one embodiment. FIGS. 16A through 16D show operations on a bitstream 1625, in accordance with the method of flowchart 1500.

Figure 16A:
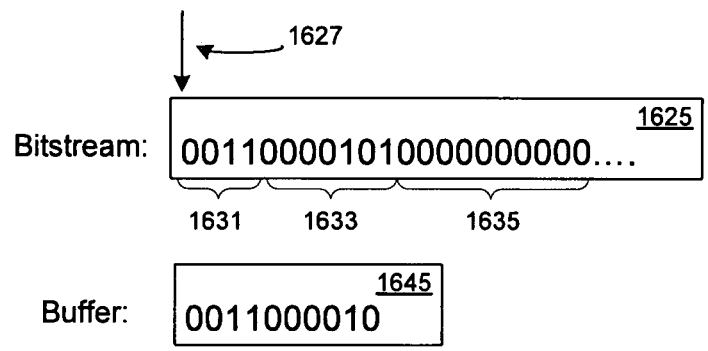
FIGS. 16A, 16B, 16C, and 16D depicts an exemplary VLC decoding process on a bitstream, in accordance with one embodiment

As shown in FIG. 16A, bitstream 1625 is made up of several variable length symbols strung together. As the maximum length of a VLC symbol for this format is 10 bits, the first 10 bits of bitstream 1625 are scanned into a buffer 1645. In the depicted embodiment, because the scan operation has been used, bitstream memory pointer 1627 is not moved. In another embodiment, e.g., where a read operation is used, bitstream memory pointer 1627 may move to the end of the accessed portion of the bitstream.

The contents of buffer 1645 are then compared with a number of threshold values, e.g., the threshold values depicted in base table 1200. Every comparison where buffer 1645 is greater than or equal to the threshold value returns 1 (true). The sum of these true results indicates the VLC group for the current symbol. In the embodiment depicted in FIG. 16A, the first 1645 is greater than or equal to the threshold values for the first six VLC groups, but less than the threshold for the seventh group, indicating that the current symbol belongs in VLC group 6.

The VLC group is used to address the base table, e.g., a table 1200, and retrieve the appropriate base triplet. In the depicted embodiment, the base triplet is made up of an nbit value (4), a threshold value (0011000000), and an offset value (<Table 2 Address+39>).

Figure 16B:
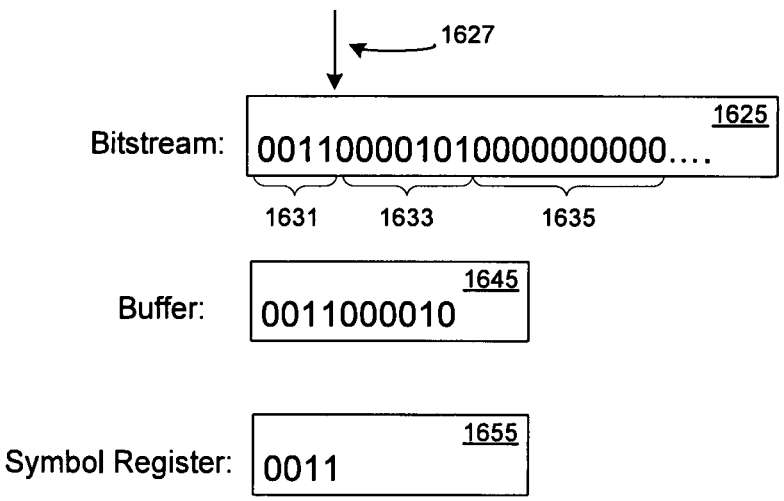

As shown in FIG. 16B, the current symbol is obtained from bitstream 1625, and stored in symbol register 1655. The base triplet, and specifically the nbit value, indicates that the current symbol is four bits in length. Accordingly, in this embodiment, the first four bits of bitstream 1625 are scanned into memory. In another embodiment, the current symbol may be retrieved from buffer 1645, rather than bitstream 1625.

Symbol register 1655, in combination with the threshold value and the memory offset, is used to address secondary table 1300. The offset value indicates the starting position within secondary table 1300 for entries in group 6; the value stored in symbol register 1655, in combination with a threshold value, provides an index. In the depicted embodiment, the current symbol (symbol 1631) corresponds to the first entry in group 6, and its symbol value is stored at memory position <Table 2 Address+39>. The symbol value for symbol 1631 is the 2-tuple 1/1.

Secondary table 1300 also stores the actual code length for the current symbol. For the current symbol, symbol 1631, its code length (4) is equivalent to the nbit value (4) provided by base table 1200. The code length is used to move memory pointer 1627, e.g., by performing a flush operation on bitstream 1625, to move memory pointer 1627 to the end of the current symbol.

Figure 16C:
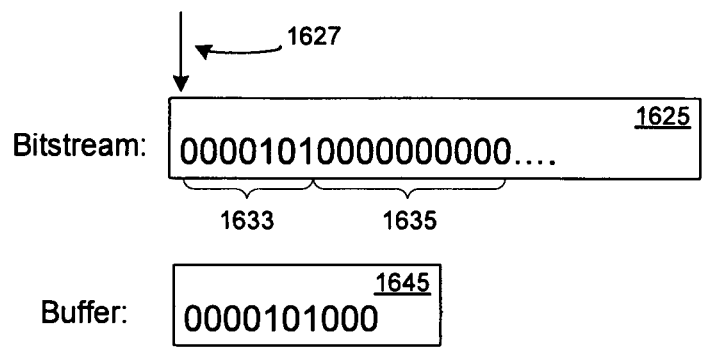
Figure 16D:
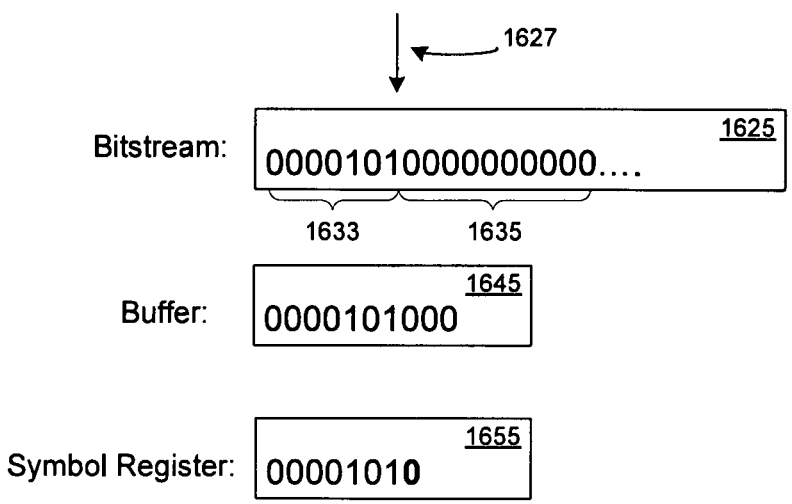

As shown in FIG. 16C, when decoding the next VLC symbol in bitstream 1625, e.g., symbol 1633, a similar process is followed. The first 10 bits of bitstream 1625 are loaded into buffer 1645, and compared against the threshold values, as shown in base table 1200. Here, the threshold comparison indicates that the current symbol is part of the third VLC group, with an nBit value of 8, a threshold value of 0000100000, and an offset of <Table 2 Address+18>. The first eight bits are then read into symbol register 1655, as shown in FIG. 16D. Using the base triplet associated with VLC group 3, an index is calculated for secondary table 1300, and the corresponding symbol value (¼) is retrieved. Here, however, the retrieved code length (7) differs from the nBit value from the base triplet. In this case, the code length is used to move memory pointer 1627 to the end of symbol 1633. If, instead, the nBit value were used to move memory pointer 1627, the first bit of the following symbol, 1635, would be inappropriately discarded.

Figure 17:
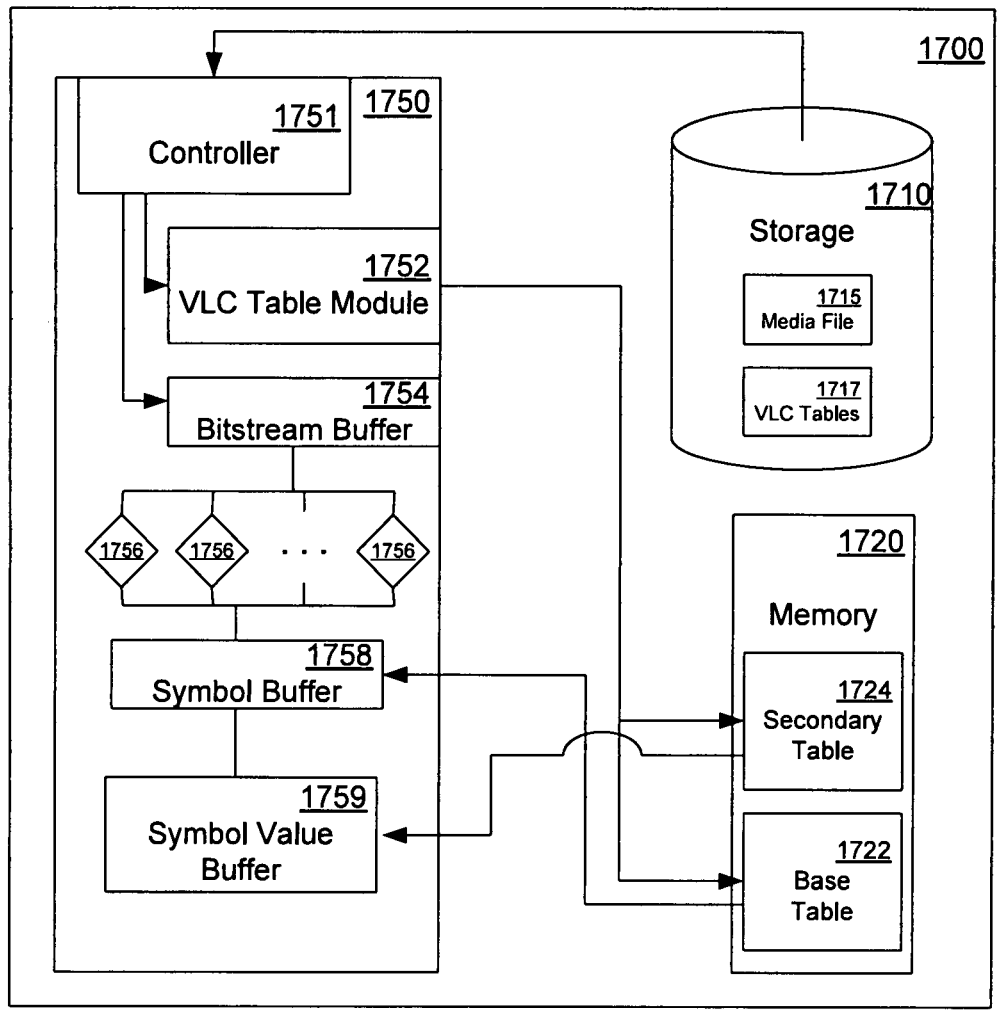
FIG. 17 is a block diagram system for VLC symbol decoding, in accordance with one embodiment.

With reference now to FIG. 17, a system 1700 for decoding a variable length code (VLC) symbol is depicted, in accordance with one embodiment. While system 1700 is shown as incorporating specific, enumerated features and elements, it is understood that other embodiments are well suited to applications involving additional, fewer, or different features, elements, or arrangements. Moreover, is understood that system 1700 may be implemented in hardware, e.g., through use of dedicated electronic components, through software, e.g., as a collection of programmatic modules, or as a combination of these.

System 1700 is shown as incorporating storage element 1710. Storage element 1710 may take different forms, in different embodiments. For example, in one embodiment, storage element 1710 is a magnetic hard disk drive. In the depicted embodiment, storage element 1710 is shown as storing media file 1715. Storage element 1710 is also shown as storing VLC tables 1717; in the depicted embodiment, system 1700 is used for decoding media files with fixed VLC tables, e.g., MP3 files.

System 1700 is also shown as including memory 1720. In different embodiments, memory 1720 may take different forms. Memory 1720, in the depicted embodiment, is used to store base table 1722, and secondary table 1724.

System 1700 is also shown as including VLC decoding engine 1750. In the depicted embodiment, VLC decoding engine 1750 incorporates controller module 1751, VLC table module 1752, bitstream buffer 1754, a plurality of threshold comparators 1756, symbol buffer 1758, and symbol value buffer 1759.

Operation of system 1700, according to the depicted embodiment, involves passing media file 1715 to VLC decoding engine 1750, where it is received by controller module 1751. The format of media file 1715 is determined, e.g., from header information included in media file 1715. This format is used by VLC table module 1752 to retrieve the appropriate base table and secondary table from storage, e.g., VLC tables 1717 stored in storage 1710. Controller module 1751 accesses base table 1722, and obtains threshold information for each VLC group described therein. This threshold information is loaded into the plurality of threshold comparators 1756.

A portion of the bitstream associated with media file 1715, e.g., the ML bits, where ML is the maximum length of a VLC symbol in the associated format, is loaded into bitstream buffer 1754. The contents of bitstream buffer 1754 are then compared with each threshold comparator 1756; the results of these comparisons will identify the VLC group of the current symbol. Once the appropriate VLC group has been determined, group information can be obtained from base table 1722. This group information, in turn, allows for the extraction of the current symbol from the bitstream; the symbol is stored in symbol buffer 1758.

The combination of the group information and the symbol is used to access secondary table 1724 and extract the symbol value for the current symbol, which can then be stored in symbol value buffer 1759. In some embodiments, the current symbol may be an expanded symbol, such as described above. In such an embodiment, secondary table 1724 includes code length information for each entry, which allows the current symbol to be extracted from the bitstream, without inadvertently discarding portions of the following symbol.

Embodiments of the present invention are thus described. While the present invention has been described in particular embodiments, it should be appreciated that the present invention should not be construed as limited by such embodiments, but rather construed according to the following claims.

What is claimed is:

1. A method of decoding variable length code (VLC) symbols, comprising:
obtaining a bitstream sample from a bitstream;
comparing said bitstream sample against a threshold value, to obtain a VLC group number;
retrieving information associated with a VLC group, using said VLC group number;
extracting a current VLC symbol from said bitstream, using said VLC group information; and
obtaining a symbol value, using said current VLC symbol and said VLC group information.

2. The method of claim 1, further comprising:
accessing said threshold value.

3. The method of claim 1, wherein said VLC group information comprises:
bit length information, indicating a length in bits of entries in said VLC group;
said threshold value, identifying a smallest VLC symbol in said VLC group; and
a memory offset, for use in obtaining said symbol value from a location in memory.

4. The method of claim 3, wherein said threshold value is padded with zeros, in order to be equal in length to said bitstream sample from said bitstream.

5. The method of claim 3, wherein said obtaining comprises:
performing a scan operation on said bitstream to obtain said bitstream sample; and
loading said bitstream sample into a memory buffer.

6. The method of claim 3, wherein said obtaining comprises:
performing a read operation on said bitstream to obtain said bitstream sample; and
loading said bitstream sample into a memory buffer.

7. The method of claim 6, wherein said extracting comprises:
obtaining said current VLC symbol from said memory buffer, with reference to said bit length information.

8. The method of claim 1, further comprising:
comparing said bitstream sample against a plurality of threshold values, each of said plurality of threshold values associated with one of a plurality of Huffman groups.

9. The method of claim 8, further comprising:
obtaining said plurality of threshold values from a base table comprising information about a plurality of VLC groups.

10. The method of claim 1, wherein said current VLC symbol comprises an expanded VLC symbol.

11. The method of claim 10, further comprising:
obtaining a code length for said expanded VLC symbol, using said current VLC symbol and said VLC group information.

12. The method of claim 1, further comprising:
identifying a media format with which said bitstream is associated.

13. A system for decoding variable length code (VLC) symbols in a media file, comprising:
a controller module, for performing operations on said media file;
a VLC table module coupled to said controller module, for retrieving a base table and a secondary table from a storage device;
a bitstream buffer coupled to said controller module, for storing a data excerpt from media data included in said media file; and
a plurality of threshold comparators coupled to said controller module, for identifying a VLC group corresponding to a current VLC symbol,
wherein said controller module obtains group information associated with said VLC group from said base table, and uses said group information to obtain a symbol value corresponding to said current VLC symbol.

14. The system of claim 13, wherein said base table comprises a plurality of VLC group information corresponding to a plurality of VLC groups.

15. The system of claim 14, wherein said VLC table module retrieves said base table and said secondary table, with reference to a format of said media file.

16. The system of claim 14, wherein each of said plurality of VLC group information comprises:
bit length information for a plurality of entries in said corresponding VLC group;
a threshold value, corresponding to a lowest symbol in said corresponding VLC group; and
an offset, corresponding to a location in said secondary table.

17. The system of claim 14, wherein said current VLC symbol comprises an expanded VLC symbol, and said secondary table comprises a code length for said expanded VLC symbol.

18. A method of decoding variable length code (VLC) symbols in a media file, comprising:
scanning a plurality of bits from a bitstream associated with said media file into a bitstream buffer;
identifying a VLC group corresponding to a current VLC symbol stored in said bitstream buffer;
retrieving group information associated with said VLC group from a base table; and
obtaining a symbol value for said current VLC symbol from a secondary table, with reference to said group information.

19. The method of claim 18, wherein said scanning comprises scanning in a number of bits from said bitstream, said number associated with a format of said media file.

20. The method of claim 18, wherein said current VLC symbol comprises an expanded VLC symbol, and further comprising:
obtaining a code length for said expanded VLC symbol, with reference to said group information and said current VLC symbol.

* * * * *